United States Patent [19]

Miyata et al.

[11] 4,146,906
[45] Mar. 27, 1979

[54] LOW FORWARD VOLTAGE DROP SEMICONDUCTOR DEVICE HAVING POLYCRYSTALLINE LAYERS OF DIFFERENT RESISTIVITY

[75] Inventors: Kenji Miyata, Ibaraki; Mitsuru Ura; Takuzo Ogawa, both of Hitachi, all of Japan

[73] Assignee: Hitachi, Ltd., Japan

[21] Appl. No.: 762,128

[22] Filed: Jan. 24, 1977

[30] Foreign Application Priority Data

Jan. 23, 1976 [JP] Japan .................................. 51-5972

[51] Int. Cl.² ........................................... H01L 29/04
[52] U.S. Cl. ........................................ 357/59; 357/38; 357/51; 357/90
[58] Field of Search ..................... 357/51, 34, 36, 38, 357/59, 90

[56] References Cited

U.S. PATENT DOCUMENTS

| | | | |
|---|---|---|---|
| 3,460,007 | 8/1969 | Scott | 357/59 |
| 3,504,239 | 3/1970 | Johnson et al. | 357/51 |
| 3,609,476 | 9/1971 | Storm | 357/38 |
| 3,892,606 | 7/1975 | Chappglow et al. | 357/59 |
| 3,902,188 | 8/1975 | Jacobson | 357/51 |
| 4,008,484 | 2/1977 | Maekawa et al. | 357/59 |

FOREIGN PATENT DOCUMENTS 2449688  4/1976  Fed. Rep. of Germany ............. 357/59

Primary Examiner—Joseph E. Clawson, Jr.
Attorney, Agent, or Firm—Craig & Antonelli

[57] ABSTRACT

A semiconductor device has one layer of a diode formed by diffusion of an impurity from a polycrystalline layer portion formed on a region in which the layer is to be formed. The polycrystalline layer portion is composed of two layers, the resistivity of the polycrystalline layer closer to the above-mentioned one layer of the diode being higher than that of the other polycrystalline layer.

21 Claims, 8 Drawing Figures

LOW FORWARD VOLTAGE DROP SEMICONDUCTOR DEVICE HAVING POLYCRYSTALLINE LAYERS OF DIFFERENT RESISTIVITY

BACKGROUND OF THE INVENTION

1. Field of the Invention

The present invention relates to a semiconductor device which exhibits a low voltage drop in the conductive state. More particularly, it relates to a semiconductor device which has an impurity-doped polycrystalline semiconductor layer on one surface of a semiconductor substrate and which is formed with a P-N junction within the semiconductor substrate by the diffusion of an impurity in the polycrystalline semiconductor layer.

2. Description of the Prior Art

The diode is a semiconductor device comprising a semiconductor substrate which has an energy barrier, and a pair of main electrodes which are provided on both sides of the barrier of the semiconductor substrate. When biased in the forward direction, by the application of a voltage between the pair of main electrodes, a low impedance is presented, so that current can easily flow; for a reverse bias, a high impedance is presented so that the flow of current is difficult. One of the important characteristics which the diode exhibits when biased in the forward direction is the characteristic of forward voltage drop.

In recent years, low voltages have been often used in computers and their terminals, equipment for automobiles, etc. Regarding diodes for such uses, those having low forward voltage drops have been especially desired. As a diode having a low forward voltage drop, the Schottky barrier diode has hitherto been known. This diode, however, has disadvantages in that the reverse blocking voltage is low and that the high temperature characteristic is poor. As a further disadvantage, it is difficult with present-day technology to fabricate a diode having a large current capability or a large Schottky barrier area with good reproducibility. On the other hand, a P-N junction diode can achieve a high blocking voltage and a large current capability comparatively easily, but it has the disadvantage that the forward voltage drop is ordinarily as great as 1-2 (V). For these reasons, a diode which has a low forward voltage drop and which has a high blocking voltage and large capability has been desired.

The thyristor is a semiconductor device comprising a semiconductor substrate which consists of at least four alternate P-N-P-N layers, a pair of main electrodes which respectively contact both the outer layers of the semiconductor substrate, and a trigger input such as a gate electrode, which supplies to the semiconductor substrate a trigger signal for shifting the current flow path between the pair of main electrodes from the non-conductive state to the conductive state. Also, this device has the same requirements as the diode where it is to be applied to a low voltage circuit.

SUMMARY OF THE INVENTION

An object of the invention is to provide a novel semiconductor device which has a low forward voltage drop, which has a high blocking voltage and large current capability and which has a good yield of fabrication.

The semiconductor device of the invention for accomplishing such an object is characterized in that a semiconductor polycrystalline layer of one conductivity type is formed on a semiconductor single-crystal layer having the other conductivity type, that an impurity which determines the conductivity type of the semiconductor polycrystalline layer is diffused into the semiconductor single-crystal layer to thus form a region of the one conductivity type, and that the resistivity of the semiconductor polycrystalline layer is made higher on the side near to the semiconductor single-crystal layer than on the side remote therefrom.

DESCRIPTION OF THE PREFERRED EMBODIMENTS

Figure 1:
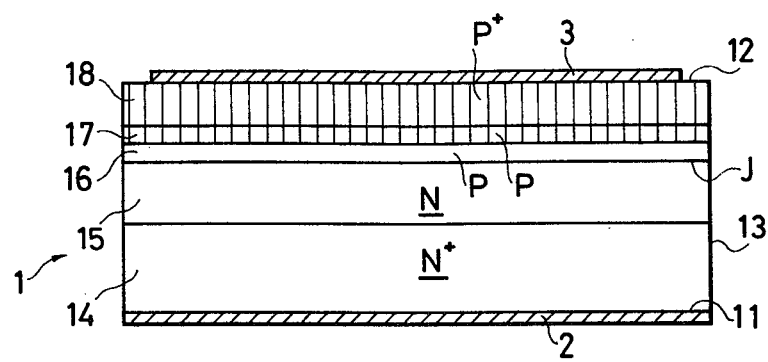
FIG. 1 is a sechmatic sectional view of a diode which is an embodiment of the invention.

FIG. 1 shows an embodiment where the invention is applied to a diode. In the figure, there are shown a semiconductor substrate 1 which has a pair of principal surfaces 11 and 12 located on sides opposite to each other and a side surface 13 joining the principal surfaces. Between the pair of principal surfaces, there are a first silicon single-crystal layer 14 which adjoins the principal surface 11 and which has N-type conductivity, a second silicon single-crystal layer of the N-type conductivity 15 which adjoins the first silicon single-crystal layer 14 and which has a resistivity higher than that of the first silicon single-crystal layer 14, a third silicon single-crystal layer 16 of P-type conductivity which adjoins the second silicon single-crystal layer 15 and which forms a P-N junction J between it and the second silicon single-crystal layer 15, a first silicon polycrystalline layer 17 of P-type conductivity which adjoins the third silicon single-crystal layer 16, and a second silicon polycrystalline layer 18 of P-type conductivity which adjoins the first silicon polycrystalline layer 17 and also adjoins the other principal surface 12 and which has a resistivity lower than that of the first silicon polycrystalline layer 17. The third silicon single-crystal layer 16 is a very thin layer which has been formed in such a way that an impurity which determines the conductivity type of the first silicon polycrystalline layer 17 adjoining it diffuses therefrom. Numerals 2 and 3 indicate first and second main electrodes which are in ohmic contact with the first silicon single-crystal layer 14 and the second silicon polycrystalline layer 18 on the principal surfaces 11 and 12 of the semiconductor substrate 1, respectively.

The diode of this embodiment can be produced by, for example, the method described below. An N-type epitaxial layer (corresponding to the layer 15) having a resistivity of 6Ω-cm and a thickness of 5 to 7 μm is formed by a known method on one surface of an N-type silicon single-crystal plate (corresponding to the layer 14) which is doped at a high concentration and which has a resistivity of 0.005Ω-cm to 0.01Ω-cm and a thickness of 250μm. Further, a P-type silicon polycrystalline layer (corresponding to the layer 17) doped with boron is formed on the epitaxial layer. As a process for forming the silicon polycrystalline layer, there can be used the thermal decomposition of a hydride of silicon, hydrogen reduction of a chloride of silicon, sputtering, or vacuum evaporation.

Now there will be explained a case where the polycrystalline layer is formed by the hydrogen reduction employing trichlorosilane (SiHCl) as a raw material. A graphite stand in a reaction chamber is maintained at 950° C. by high frequency induction heating; the N-type silicon single-crystal plate formed with the N-type epitaxial layer in advance is placed on the stand, and 30 l/min. of hydrogen, 4.6 mol %/min. of trichlorosilane and $1.4 \times 10^{-5}$ mol %/min. of dihydrodiborane ($B_2H_6$) are mixed and are caused to flow into the reaction chamber for 5 minutes. Thus, the P-type silicon polycrystalline layer having a resistivity of 2.5Ω-cm is formed to a thickness of 5μm. Subsequently, the mixture is caused to flow for 20 minutes by increasing the flow rate of dihydrodiborane to $1.4 \times 10^{-3}$ mol %/min. being approximately 100 times greater than in the above and keeping the other conditions the same. Thus, the P-type silicon polycrystalline layer (corresponding to the layer 18) having a resistivity of 0.02Ω-cm is formed to a thickness of 20μm. During the formation of this polycrystalline layer, boron in the polycrystalline layer enters into the N-type epitaxial layer by diffusion, with the result that a P-type diffused layer (corresponding to the layer 16) of about 0.5μm and $2 \times 10^{12}$ atoms/cm² is formed. In case of employing a method of forming the polycrystalline layer without a high temperature atmosphere, a heat treatment necessary for forming the P-type diffused layer must be added after the formation of the polycrystalline layer.

According to such a construction, there can be obtained a diode which has a low forward voltage drop and which has a high blocking voltage and large current. This will be described in detail below.

The forward voltage drop of the diode consists of the following voltage drops:

(1) A voltage drop due to the contact resistance between the electrode 2 and the first silicon single-crystal layer 14.

(2) A voltage drop within the first silicon single-crystal layer 14.

(3) A voltage drop within the second silicon single-crystal layer 15.

(4) A voltage drop $V_J$ at the junction J.

(5) A voltage drop within the third silicon single-crystal layer 16.

(6) A voltage drop within the first and second silicon polycrystalline layers 17 and 18.

(7) A voltage drop due to the contact resistance between the electrode 3 and the second silicon polycrystalline layer 18.

Among the voltage drops, (1) and (2) can be neglected by making the impurity concentration of the first silicon single-crystal layer 14 sufficiently high. This is commonly done.

Figure 2:
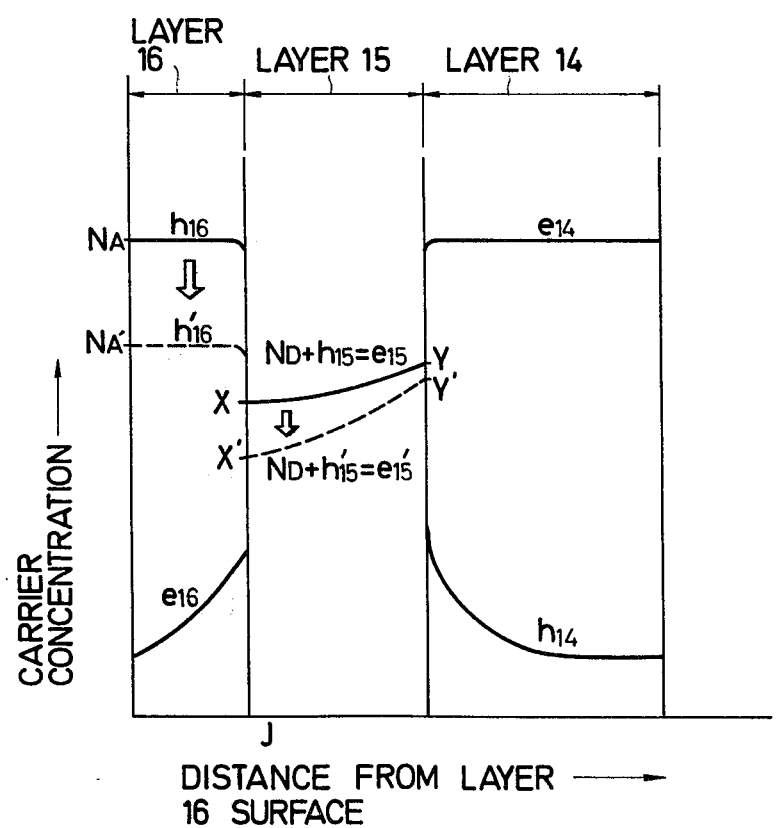
FIG. 2 is a diagram of the distribution of carrier concentrations for explaining the principle in which the junction potential is decreased by lowering the impurity concentration of a layer on one side of a P-N junction.

Regarding the voltage drop (4), considering that the impurity concentration of the second silicon single-crystal layer 15 is fixed, the junction potential of the P-N junction is smaller as the impurity concentration of the third silicon single-crystal layer 16 is lower and the thickness thereof is smaller. The reasons therefor will be explained with reference to FIGS. 2 and 3. FIG. 2 is a diagram which qualitatively illustrates the carrier concentration distributions of the single-crystal layers 14, 15, and 16 of the diode of FIG. 1 in a large current region. In the Figure, the abscissa represents the distance from the surface of the third silicon single-crystal layer 16, and the ordinate is the carrier concentration. A curve h indicates the hole concentration and a curve e the electron concentration. Since the so-called conductivity modulation takes place in the large current region within the second silicon single-crystal layer 15, the carrier concentration is higher than the impurity concentration $N_D$ inherent to this layer. The positive carrier concentration and the negative carrier concentration of the second silicon single-crystal layer 15 are equal owing to the principle of neutrality. In general, the junction potential $V_J$ has the following relation:

$$V_J = \frac{k \cdot T}{q} \ln \frac{X \cdot Y}{n_i^2} \qquad (1)$$

where, as indicated in FIG. 2, X denotes the carrier concentration of the second silicon single-crystal layer 15 at the P-N junction J and Y denotes the carrier concentration there of at the boundary between the first silicon single-crystal layer 14 and the second silicon single-crystal layer 15, and where q denotes the charge of electron, k Boltzmann's constant, T absolute temperature and $n_i$ the carrier concentration of the intrinsic semiconductor. Now, the impurity concentration $N_A$ of the third silicon single-crystal layer 16 is lowered to $N_A'$. Then, since the hole concentration of the third silicon single-crystal layer 16 is substantially equal to the impurity concentration thereof, it decreases. Therefore, carriers to be injected into the second silicon single-crystal layer 15 decrease, and the points X and Y lower to X' and Y' respectively as shown by a broken line in FIG. 2. Consequently, the voltage drop $V_J$ decreases, as will be understood from Equation (1).

Figure 3:
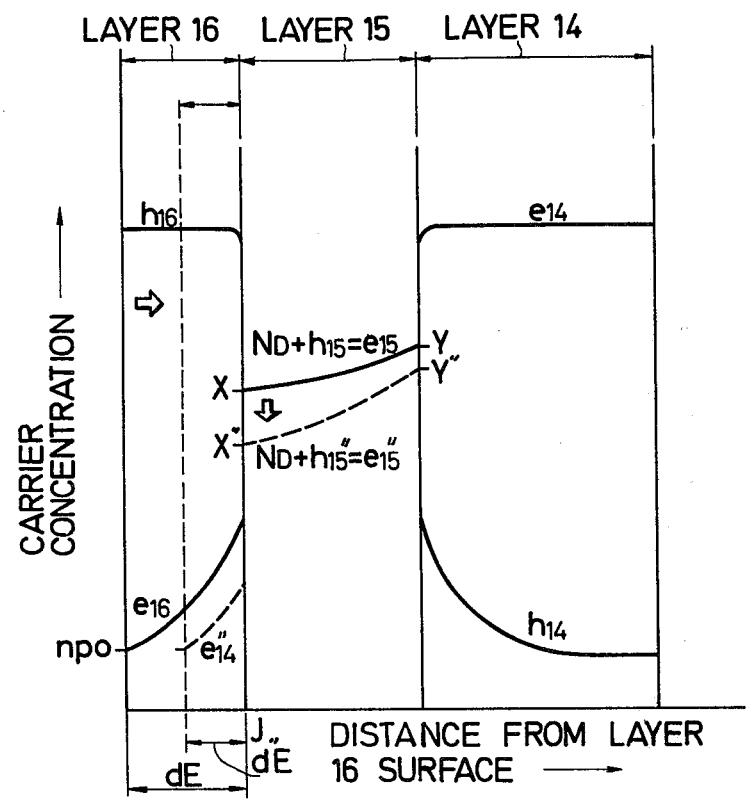
FIG. 3 is a diagram of the distribution of carrier concentrations for explaining the principle in which the junction potential is decreased by reducing the thickness of a layer on one side of a P-N junction.

FIG. 3 is a diagram which qualitatively illustrates the changes of the carrier concentration distributions in the respective layers at the time when the thickness of the third silicon single-crystal layer 16 has been reduced. As in FIG. 2, the abscissa represents the distance from the surface, the ordinate represents the carrier concentration, a curve h indicates the hole concentration, and curve e is electron concentration. In this case, there is the boundary condition that the electron concentration in the surface of the third silicon single-crystal layer 16 is equal to the thermal equilibrium value $np_o$. Therefore, when the thickness $d_E$ of the third silicon single-crystal layer 16 is reduced to $d_E''$ as indicated in FIG. 3, the electron concentration of the third silicon single-crystal layer 16 decreases as indicated by the broken line. For this reason, the carrier concentration of the second silicon single-crystal layer 15 is lowered as shown by the broken line in FIG. 3, and points X and Y are lowered to X" and Y" respectively. Accordingly, the voltage drop $V_J$ decreases, as is apparent from Equation (1). In this manner, the voltage drop $V_J$ can be decreased by reducing the impurity concentration $N_A$ or thickness $d_E$ of the third silicon single-crystal layer 16. By the way, the total impurity quantity Q per unit area of the third silicon single-crystal layer 16 is expressed by the product between the impurity concentration $N_A$ per unit volume of the third silicon single-crystal layer 16 and the thickness $d_E$ of the layer 16, i.e., $Q = N_A \times d_E$. Therefore, the voltage drop $V_J$ is decreased by making the quantity Q small.

The voltage drop (3) will now be discussed. In the large current region, when considered with the thickness of the second silicon single-crystal layer 15 held constant, the voltage drop (3) becomes smaller as the injection efficiency of the junction J is higher and the lifetime of the carrier within the layer 15 is longer. It is generally possible to make the thickness of the layer 15 sufficiently smaller than the carrier diffusion length. Therefore, the length of the lifetime need not be considered, and the voltage drop within the layer 15 can be made small in such a way that the conductivity modulation within the layer 15 is increased by enhancing the injection efficiency. Herein, the injection efficiency is higher as the impurity concentration of the layer 16 is higher or as an impurity gradient at a part shifting from the layer 16 to the layer 15 is greater. This signifies that, when the impurity concentration of the layer 16 is made high in order to decrease the voltage drop within the layer 15, the contrary situation in which the voltage drop $V_J$ at the junction J increases is incurred. The inventors, however, have found that the reduction of the thickness of the layer 15 is greater than the enhancement of the injection efficiency in the extent of influence on the decrease of the voltage drop within the layer 15. It has therefore been revealed that the increase of the voltage drop within the layer 15 can be effectively suppressed by making the thickness of the layer 16 sufficiently small and avoiding an extremely low injection efficiency.

Figure 4:
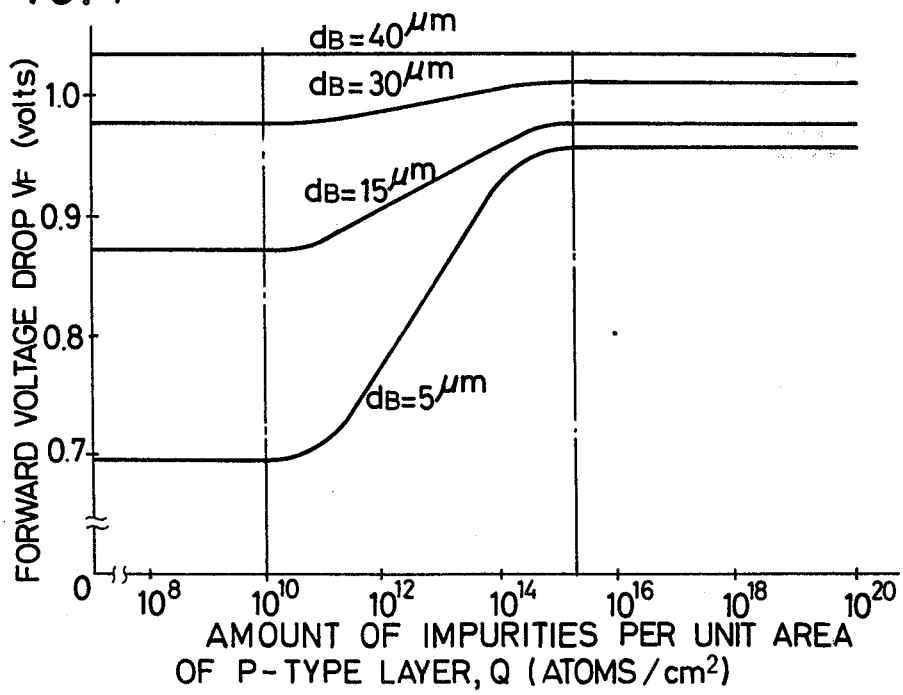
FIG. 4 is a characteristic curve diagram which illustrates the relationship between the total impurity quantity per unit area of the P-type layer of a diode and the forward voltage drop, with the parameter being the thickness of an intermediate high-resistance layer.

The voltage drops (3) and (4) will be explained with reference to FIG. 4 and as to examples of concrete numerical values. FIG. 4 illustrates the relationship between the total impurity quantity Q and the forward voltage drop $V_F$ with the parameter being the thickness $d_B$ of the layer 15, the relationship having been obtained by fabricating a large number of diodes different in the thickness $d_B$ of the layer 15 and the total impurity quantity Q per unit area of the layer 16 and measuring the forward voltage drops $V_F$ of the diodes. The thickness of the first silicon polycrystalline layer 17 was held constant at 1μm, and the impurity concentration thereof was varied. The thickness and the resistivity of the second silicon polycrystalline layer 18 where held constant at 20μm and 0.02Ω-cm, respectively. The forward current density was made 100 A/cm². As shown in the Figure, if the thickness $d_B$ of the second silicon single-crystal layer 15 does not exceed 30μm, the forward voltage drop $V_F$ is varied by changing the total impurity quantity Q per unit area of the third silicon single-crystal layer 16. More specifically, if the total impurity quantity Q is greater than $2 \times 10^{15}$ atoms/cm², the forward voltage drop $V_F$ does not vary even by changing the quantity Q. However, when the total impurity quantity Q becomes $2 \times 10^{15}$ atoms/cm² or less, the forward voltage drop $V_F$ lowers though the extent differs in dependence on the magnitude of the thickness $d_B$. As is apparent from the Figure, the tendency in which the forward voltage drop $V_F$ decreases by reducing the quantity Q of the layer 16 is seen down to $1 \times 10^{10}$ atoms/cm², below which the forward voltage drop $V_F$ becomes constant in spite of the changes of quantity Q. In order to form the layer 16 having the total impurity quantity Q of $2 \times 10^{15}$–$1 \times 10^{10}$ atoms/cm² as described above, it is necessary to make the thickness of the layer very small. By way of example, in the case of setting the quantity Q at $1 \times 10^{10}$ atoms/cm², when the average impurity concentration is made $1 \times 10^{18}$ atoms/cm³, the thickness becomes 0.0001 μm, and even when the average impurity concentration is made $1 \times 10^{15}$ atoms/cm³, the thickness becomes 0.1 μm. A method for forming such extremely thin layer at good reproducibility is, with present-day technology, a diffusion process which employs as a diffusion source a silicon polycrystalline layer doped with an impurity, especially a diffusion process which employs as the source the doped polycrystalline silicon directly deposited on the pellet to be diffused with the impurity. Accordingly, a diode whose voltage drops (3) and (4) are small can be obtained with good reproducibility by adopting a method in which a polycrystalline silicon layer doped with an impurity presenting a conductivity opposite to that of the layer 15 is deposited on the layer 15 and in which the impurity is diffused from the doped polycrystalline silicon layer into the layer 15 so as to form the layer 16.

Regarding the voltage drop (5), since the layer 16 is formed to be very thin as stated above, the forward voltage drop $V_F$ is hardly affected.

Subsequently, the voltage drops (6) and (7) can be made small by restraining to a required thickness the thickness of the first silicon polycrystalline layer 17 contributive to the determination of the total impurity quantity Q of the layer 16 and by lowering the resistivity of the second silicon polycrystalline layer 18 contacting with the electrode 3. This can be comprehended from the following table:

| Sample No. | Thickness/Resistivity of Layer 17 | Thickness/Resistivity of Layer 18 | $V_f$ |
|---|---|---|---|
| 1 | 5 μm/2.5 Ω-cm | 20 μm/0.02 Ω-cm | 0.72 V |
| 2 | Layer 17 is not provided. | 25 μm/0.02 Ω-cm | 0.87 V |
| 3 | 25 μm/2.5 Ω-cm | Layer 18 is not provided. | 2.5 V |
| 4 | 25 μm/1 Ω-cm | Layer 18 is not provided | 0.98 V |

In order for the diode of the invention to accomplish the object thereof, it is desirable that the layers 17 and 18 have predetermined thicknesses and resistivities. This will be explained hereunder.

The forward voltage drop at which the diode demonstrates the effect as one of low voltage drop and by which its utility value becomes apparent is 0.9 V or lower relative to the standard current density of diodes or 100 A/cm². Of course, in this case, any treatment shortening the lifetime, for example, the diffusion of a heavy metal or the irradiation by radioactive rays has not been carried out, the forward voltage drop becomes greater than 0.9 V. As the result of experiments, it has been confirmed that the resistivity of the layer 18 must be at most 0.05Ω-cm in order to realize the low resistance ohmic contact with the main electrode 3. As the thickness of the layers 17 and 18 are smaller, the forward voltage drop becomes smaller. However, there is the limitation that at the alloying or sintering with the main electrode 3, the P-N junction must not be destroyed by the reaction. As the result of experiments, the inventors have confirmed that diodes which exhibit normal characteristics are obtained even when the layers 17 and 18 are made thin, down to 2μm. Therefore, this value becomes the lower limit of the sum between the respective thickness of the layers 17 and 18.

Now, the layer 17 will be explained in more detail. If the resistivity of this layer is a value low enough to establish a good ohmic contact with the main electrode, the junction potential of the P-N junction cannot be suppressed to be low. Only when the resistivity of this layer is higher than that of the layer 18, can the effect of the invention be expected. That is, resistivity of the layer 17 must be made at least 0.05Ω-cm. The layer 17 not only functions as the diffusion source of the impurity for forming the P-N junction, but also serves to prevent the impurity from the layer 18 from diffusing into the layer 16 and rendering the impurity concentration of this region high. To this end, the thickness of the layer 17 must be at least 0.1 μm.

On the other hand, in the forward voltage drop of the device at the current density of 100 A/cm$^2$, the voltage drop of the remaining portion, except the voltage drop components within the ohmic contact portions and the polycrystalline layers, is about 0.65 V at the minimum. In this respect, the resistances of the ohmic contact portions can be deminished to a negligible extent in accordance with the structure of the invention. Accordingly, in order to demonstrate the effect as the low loss diode, 0.25V becomes the maximum voltage drop permissible within the polycrystalline layers.

In case where, as in the above embodiment, the resistivity of the layer 18 is set to be much lower than that of the layer 17, almost all of the voltage 0.25V may take place in the layer 17. In this case, when the thickness of the layer 17 is made the minimum thickness 0.1 μm, the maximum resistivity which this layer can take is determined to be 250Ω-cm. When the resistivity of this layer is made 0.05Ω-cm being the minimum value at which the effect of the invention is expected, the junction potential increases, and hence, the voltage drop permissible within the layer 17 becomes 0.015 V. In order to fulfill this condition, the upper limit 30 μm of the thickness of the layer 17 is determined.

Where the resistivity of the layer 18 is 0.05Ω-cm, being the upper limit value for making the ohmic contact possible, the voltage drop in this layer becomes 0.25 V at a thickness of 500 μm. However, when the resistivity of the layer 18 is lower, the thickness of this layer can be made greater. For example, in case of polycrystalline silicon, the resistivity can be easily lowered down to 0.001Ω-cm. In this case, the thickness of the layer 18 can be up to 2.5 cm. In ordinary semiconductor devices, however, such a thickness is economically disadvantageous and cannot be obtained. As a consequence, the upper limit of the thickness of the polycrystalline layer 18 must not be used.

When, as in the present embodiment, the concentration of boron in the layer 17 is so low as to reduce the amount of diffusion of boron into the layer 6 and the layer 18 having the high impurity concentration is formed at the contact portion with the main electrode 3, the following advantages are achieved in addition to the effect of reducing the junction potential and the effect of making good ohmic contact with the electrode.

The distance from the P-N junction J to the main electrode 3 can be made large without increasing the forward voltage drop, by thickening the polycrystalline layer havin the high impurity concentration. As a result, the formation of the electrode can be executed without affecting the P-N junction. It is therefore possible to fabricate an element having a desired blocking voltage with a good yield.

The fact that the polycrystalline layer can be made sufficiently thick signifies that the volume for absorbing heat generated in the P-N junction becomes large. Thus, the absorption capability of surge current increases, so that the immunity to an overcurrent of short time is enhanced.

Although, in the above embodiment, a diode of P-N-N$^+$ structure has been explained, the invention is also applicable to a diode of an N-P-P$^{30}$ structure in which the N-type layer is formed by the impurity diffusion from a polycrystal, and to a diode in which the end part of the P-N junction terminates on the side of one principal surface.

Figure 5:
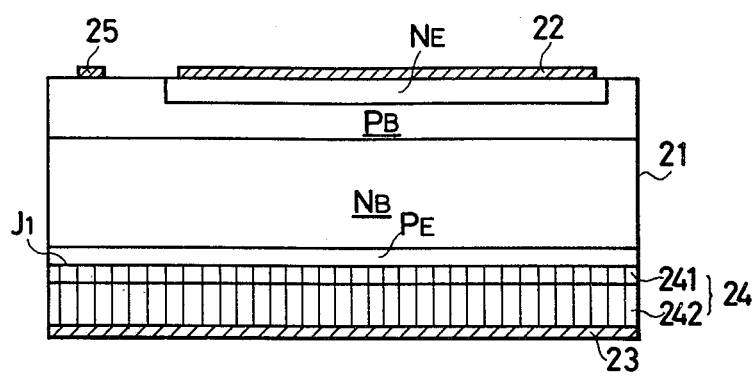
FIG. 5 is a schematic sectional view of a thyristor which is another embodiment of the invention.

FIG. 5 shows an embodiment in the case where the invention is applied to a thyristor. Numeral 21 designates a semiconductor substrate which consists of four layers of an N-type emitter $N_E$, a P-type base layer $P_B$, an N-type base layer $N_B$ and a P-type emitter layer $P_E$. Numeral 22 designates a cathode electrode in ohmic contact with the N-type emitter layer $N_E$, numeral 23 in an anode electrode in ohmic contact with the P-type emitter layer $P_E$ through a polycrystalline semiconductor layer 24, and numeral 25 is a gate electrode in ohmic contact with the P-type base layer $P_B$. The polycrystalline layer 24 is formed of a first polycrystalline layer of P-type conductivity 241 which adjoins the P-type emitter layer $P_E$ and which serves as a diffusion source for P-type emitter layer $P_E$, and a second polycrystalline layer of P-type conductivity 242 which adjoins the first polycrystalline layer 241 and which has a resistivity lower than that of the first polycrystalline layer 241. The thyristor is fabricated by a process as described below.

An N-type silicon single-crystal plate purified by the floating zone method and having a resistivity of about 40Ω-cm and a thickness of 240 μm is used as a starting material. The silicon plate is enclosed in a quartz tube along with gallium, and is heat-treated at 1,150° C. for approximately two hours to form thin P-type layers at a high impurity concentration on the surfaces of the silicon plate. The resultant silicon plate is taken out from the quartz tube, and the thin P-type layer on one surface is removed by a known method, for example, etching. Subsequently, using the remaining P-type layer as a diffusion source, the impurity is subjected to the drive-in diffusion at 1,250° C. for about 20 hours so as to form the P-type base layer $P_B$. A silicon oxide film formed during the drive-in diffusion step is partly removed with the known photoetching technique, and phosphorus is deposited on the part at 1,100° C. for about 30 minutes by employing POCl$_3$ as a source. After removing phosphorus glass formed during this step by the use of hydrofluoric acid, the N-type emitter layer $N_E$ at 6.8 × 10$^{16}$ atoms/cm$^2$ is formed by performing drive-in diffusion at 1,200° C. for about seven hours. At the next step, the resultant silicon plate is again enclosed in the quartz tube along with gallium, and the surface concentration of the P-type layer $P_B$ is increased. Subsequently, a thin P-type layer formed by this step on the surface opposite to the surface in which the N-type emitter layer $N_E$ exists is etched and removed. Thus far, an N-P-N structure is formed. The thickness of the N-type emitter layer is 15 µm, that of the P-type base layer is 30 µm, and that of the N-type base layer is 170 µm. Lastly, the P-type polycrystalline layer 24 is formed on the surface opposite to the surface in which the N-type emitter layer exists. The method of forming the polycrystalline layer 24 is the same method as in the case of the foregoing diode wherein hydrogen reduction employing trichlorosilane $SiHCl_3$ as the raw material is adopted. The layer 241 is formed to be 2.5Ω-cm and 5 µm, and the layer 242 0.02Ω-cm and 20 µm. During the formation of the polycrystalline layer 24, the impurity of P-type conductivity diffuses from the layer 241 into the N-type base layer, so that the P-type emitter layer of about 0.5 µm and $2 \times 10^{12}$ atoms/cm² is formed. Thereafter, the cathode electrode 22, the anode electrode 23 and the gate electrode 25 are formed, and the thyristor is completed. Regarding the electric characteristics of an example of the thyristor thus constructed, the forward blocking voltage was 1.050 V, the reverse blocking voltage was 1,100 V, and the forward voltage drop in the conductive state was 0.92 V at 100 A/cm². In contrast, a prior-art thyristor in which the polycrystalline layer 24 in the thyristor of FIG. 5 was not provided and whose P-type emitter layer $P_E$ was made 45 µm and $9.1 \times 10^{15}$ atoms/cm² exhibited a forward blocking voltage of 1,000 V, a reverse blocking voltage of 1,100 V, and a forward voltage drop in the conductive state of 1.09 V at 100 A/cm².

The reasons why a thyrisor of low forward voltage drop can be obtained owing to such structure will be explained hereunder.

First of all, the junction potential of the first P-N junction $J_1$ between the P-type emitter layer and the N-type base layer can be made small by making small the total impurity quantity per unit area of the P-type emitter layer. This can be understood from the fact that the thyristor can be handled similarly to the diode by substituting the layer 16 by the P-type emitter layer in FIGS. 2 and 3, the layer 15 by the N-type base layer as well as the P-type base layer, and the layer 14 by the N-type emitter layer.

Figure 6:
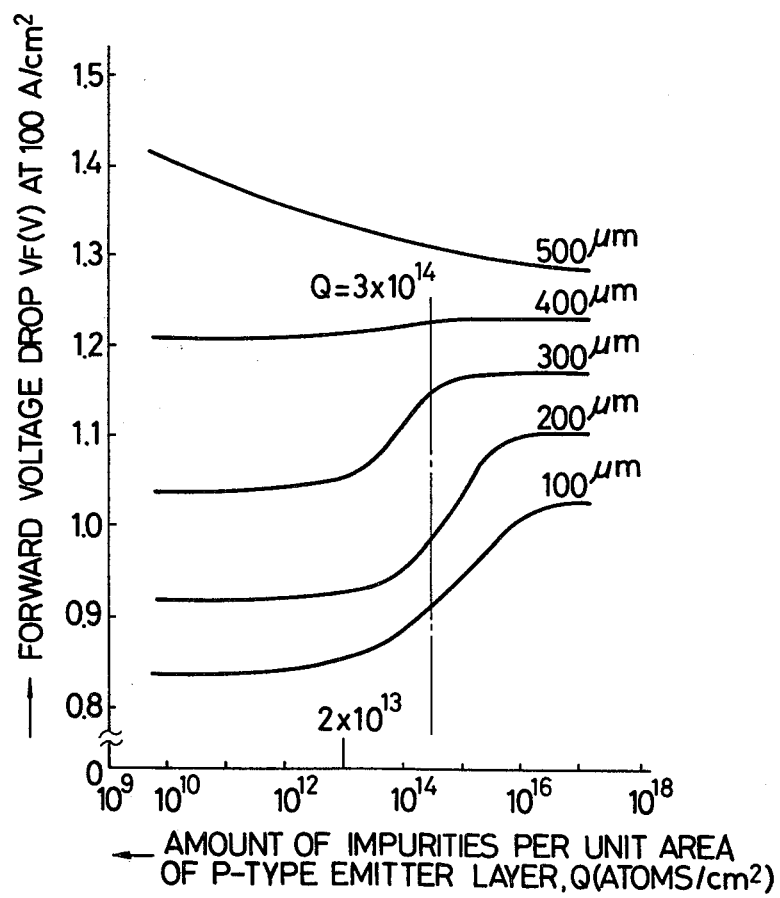
FIG. 6 is a characteristic curve diagram which illustrates the relationship between the total impurity quantity per unit area of the P-type emitter layer of a thyristor and the forward voltage drop, with the parameter being the sum between the thicknesses of the N-type base layer and the P-type base layer thereof.

FIG. 6 illustrates the relationship between the total impurity quantity per unit area of the P-type emitter layer, Q (atoms/cm²) and the forward voltage $V_F$ (V), with the parameter being the sum of the thickness of the P-type base layer and the N-type base layer. According to this diagram, it will be understood that, where the sum of the thickness of the two base layers is 400 µm or below and where the total impurity quantity per unit area of the P-type emitter layer, Q is gradually decreased, the forward voltage drop begins to decrease when the quantity Q becomes a certain value, and the forward voltage drop becomes substantially constant when the quantity Q is further reduced. The value of the quantity Q at which the effect of the invention appears by reducing the quantity Q is $3 \times 10^{16}$ atoms/cm² or below when the sum of thicknesses of the two base layers is 100 µm, $5 \times 10^{15}$ atoms/cm² or below when it is 200 µm, $1 \times 10^{15}$ atoms/cm² or below when it is 300 µm, and $3 \times 10^{14}$ atoms/cm² or below when it is 400 µm. Accordingly, if the sum of the thicknesses of the two base layers is at most 400 µm and the value of the quantity Q is at most $3 \times 10^{14}$ atoms/cm², the thyristor which achieves the effect of the invention can be obtained in any case (however the thickness may be changed in the range not exceeding 400 µm). When the quantity Q becomes $2 \times 10^{13}$ atoms/cm² or below, the decrease of the junction voltage and the increase of the voltage drops within the two base layers cancel each other, and the forward voltage drop becomes independent of the quantity Q. When fabricating the thyristor in such range of the total impurity quantity Q, even when the quantity Q fluctuates to some extent in the manufacturing process, the forward voltage drop hardly varies. In consequence, there is the effect that the enhancement of the reproducibility of the characteristics of the thyristor can be achieved. It is accordingly desirable to set the quantity Q at $2 \times 10^{13}$ atoms/cm² or below. When the value of the quantity Q is made extremely small, the thyristor does not shift to the conductive state and does not act as a switching element. It is therefore necessary to set the minimum value of the quantity Q within a range within which the function as the thyristor is accomplished. Although the minimum value of the quantity Q depends on the sheet resistance of the adjacent base layer, the minimum value of the quantity Q of the P-type emitter layer is $6 \times 10^9$ atoms/cm² where the impurity concentration of the N-type base layer is $1.3 \times 10^{14}$ atoms/cm³, and $2 \times 10^{10}$ atoms/cm² in case where it is $5 \times 10^{14}$ atoms/cm³.

A technique capable of forming, with good reproducibility, the P-type emitter layer whose total impurity quantity Q per unit area is small, is the diffusion process in which doped polycrystalline silicon deposited directly on the pellet to be diffused is sused as a source. When employing this process, layers 241 and 242 are formed at predetermined resistivities and thicknesses. Hereunder, concrete values thereof will be explained.

The forward voltage drop for which the thyristor has a low voltage drop and by which its utility value becomes apparent is 0.9 V or lower, relative to the standard current density of thyristors or 100 A/cm². As the result of experiments, it has been confirmed that the resistivity of the layer 242 must be at most 0.1Ω-cm in order to realize the ohmic contact with the anode electrode 23. As the thicknesses of the layers 241 and 242 are smaller, the forward voltage drop becomes smaller. However, there is the limitation that at the alloying or sintering with the electrode, the P-N junction must not be destroyed by the reaction. As the result of experiments, the inventors have confirmed that thyristors which exhibit normal characteristics are obtained even when the layers 241 and 242 are made thin down to 2 µm. Therefore, this value determines the lower limit of the sum between the respective thicknesses of the polycrystalline layers 241 and 242.

Now, the first polycrystalline layer 241 will be explained in more detail. It the resistivity of this layer is a low enough value to establish a good ohmic contact with the electrode, the junction potential of the P-N junction cannot be suppressed to a low value. Only when the resistivity of the layer 241 is higher than that of the polycrystalline layer 242, can the effect of this invention be expected. That is, the resistivity of the first polycrystalline layer 241 must be made at least 0.1Ω-cm. The first polycrystalline layer 241 not only functions as the diffusion source of the impurity for forming the P-N junction, but also serves to prevent the impurity from the second polycrystalline layer 242 from diffusing into the P-type diffused region and rendering the impurity concentration of this region high. To this end, the thickness of the first polycrystalline layer 241 need be at least 0.1 μm.

On the other hand, for the forward voltage drop of the device at the current density of 100 A/cm², the voltage drop of the remaining portion except the voltage drop components within the ohmic contact portions and the polycrystalline layers is about 0.65 V at the minimum. In this respect, the resistances of the ohmic contact portions can be diminished to a negligible extent in accordance with the structure of the invention. Accordingly, in order to demonstrate the effect as the low loss thyristor, 0.25 V becomes the maximum drop voltage permissible within the polycrystalline layers.

Where, as in the above embodiment, the resistivity of the second polycrystalline layer 242 is set to be much lower than that of the first polycrystalline layer 241, almost all of the voltage 0.25 V may take place in the polycrystalline layer 241. In this case, when the thickness of the layer 241 is made the minimum thickness 0.1 μm, the maximum resistivity which this layer can take is determined to be 250Ω-cm. When the resistivity of the layer 241 is made 0.1Ω-cm being the minimum value at which the effect of the invention is expected, the junction potential increases, and hence, the voltage drop permissible within this layer becomes 0.03 V. In order to fulfill this condition, the upper limit 30 μm of the thickness of the polycyrstalline layer 241 is determined.

Where the polycrystalline layer 242 has a resistivity of 0.1 Ω-cm, being the upper limit value for ohmic contact, the voltage drop in this layer becomes 0.25 V at a thickness of 250 μm. However, when the resistivity of this layer is made lower, the thickness thereof can be made greater. For example, for polycrystalline silicon, the resistivity can be easily lowered down to 0.001Ω-cm. In this case, the thickness of the layer 242 can be up to 2.5 cm. In ordinary semiconductor devices, however, such a great thickness is economically disadvantageous and cannot be obtained. In consequence, the upper limit of the thickness of the polycrystalline layer 242 is not typical.

When, as in the present embodiment, the concentration of boron in the polycrystalline layer 241 is made low so as to reduce the amount of diffusion of boron into the P-type emitter layer and the polycrystalline layer 242 having an impurity concentration higher than that of the layer 241 is formed at the contact portion with the anode electrode 23, the enhancement of the yield as to the blocking voltage and the enhancement of the withstand surge can be achieved in addition to the effect of reducing the junction potential of the junction $J_1$ and the effect of obtaining good ohmic contact with the electrode 23.

Although, in the above embodiment, a case of forming the P-type emitter layer of the thyristor by the diffusion of the impurity from the polycrystalline layer has been exemplified, the invention is also applicable to a case of forming the N-type emitter layer by the diffusion of an impurity from a polycrystalline layer.

Figure 7A:
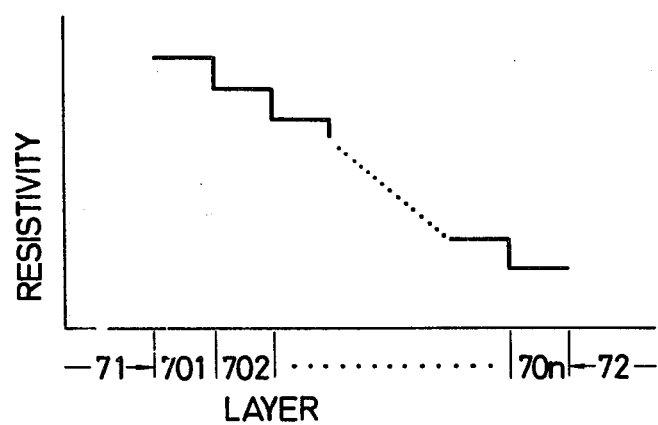
FIGS. 7a and 7b are resistivity profiles which illustrate further embodiments of polycrystalline layers.
Figure 7B:
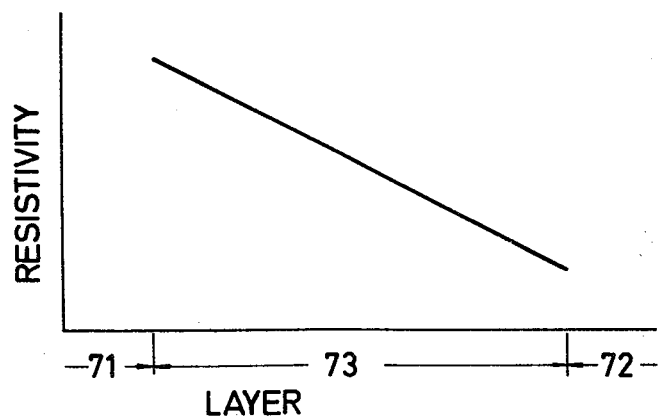

The embodiments in FIGS. 1 and 5 illustrate a diode and a thyristor, each comprising the two polycrystalline layers, respectively. However, the effect of the invention can be accomplished both when the polycrystalline layer portion is made up of a plurality of layers 701, 702 ... and 70n whose resistivities decrease stepwise from the side of a single-crystal layer 71 towards the side of an electrode 72 as shwon in FIG. 7a and when it is made up of a single layer 73 whose resistivity decreases continuously from the side of the single-crystal layer 71 towards the electrode 72, as shown in FIG. 7b.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A semiconductor device having a low forward voltage comprising:
    a semiconductor substrate including a first single-crystal layer of one conductivity type, a second single-crystal layer of the one conductivity type, adjoining said first single-crystal layer and having a higher resistivity than said first single-crystal layer, and a third single-crystal layer of the opposite conductivity type, adjoining said second single-crystal layer to form a P-N junction with said second single-crystal layer;
    a first polycrystalline layer of the opposite conductivity type having a resistivity of at least 0.05 Ω-cm, in direct contact with said third single-crystal layer;
    a second polycrystalline layer of the opposite conductivity layer superposed on and in direct contact with said first polycrystalline layer, said second polycrystalline layer having a resistivity lower than that of said first polycrystalline layer;
    a first main electrode in low resistance contact with said first single-crystal layer; and
    a second main electrode in low resistance contact with said second polycrystalline layer;
    said third single-crystal layer being formed by diffusing from said first polycrystalline layer an impurity determining the opposite conductivity type during the formation of said first and second polycrystalline layers, having a total impurity quantity of $1 \times 10^{10}$ to $2 \times 10^{15}$ atoms/cm² and a thickness smaller than that of said second single-crystal layer.

2. The semiconductor device according to claim 1, wherein said polycrystalline layer is constructed of
    a first polycrystalline layer part adjacent to said third single-crystal layer and
    a second polycrystalline layer part adjacent to said first polycrystalline layer part,
    said first polycrystalline layer part having a thickness of 0.1 to 30 μm and a resistivity of 0.05 to 250Ω-cm,
    said second polycrystalline layer part having a resistivity of at most 0.05 Ω-cm, and wherein
    the sum of the thicknesses of said first and second polycrystalline layer parts is at least 2 μm.

3. The semiconductor device according to claim 1, wherein said first polycrystalline layer has a thickness of 0.1 to 30 μm and a resistivity of 0.05 to 250Ω-cm, and the resistivity of said second polycrystalline layer is, at most, 0.05Ω-cm, and the total thickness of said first and second polycrystalline layers is at least 2 μm.

4. A semiconductor device according to claim 1 wherein said second single-crystal layer has a thickness of at most 30 μm.

5. A semiconductor device according to claim 1 wherein said first polycrystalline layer has a thickness of 0.1 to 30 Ωm and a resistivity of 0.05 to 250Ω-cm, and said second polycrystalline layer has a resistivity of at most 0.05Ω-cm.

6. A semiconductor device according to claim 1 wherein the sum of the thicknesses of said first and second polycrystalline is at least 2 μm.

7. A semiconductor device according to claim 1 wherein the sum of the thicknesses of said second and third single-crystal layers are at most 400 μm.

8. A semiconductor device having a low forward voltage comprising:
a semiconductor substrate including a first single-crystal layer of one conductivity type, a second single-crystal layer of the opposite conductivity type adjoining said first single-crystal layer to form a first P-N junction therebetween, said second single-crystal layer having a resistivity higher than that of said first single-crystal layer, a third single-crystal layer of the one conductivity type, adjoining said second single-crystal layer to form a second P-N junction therebetween, and a fourth single-crystal layer of the opposite conductivity type, adjoining said third single-crystal layer to form a third P-N junction therebetween, said fourth single-crystal layer having a resistivity lower than that of said third single-crystal layer;
a first polycrystalline layer of the opposite conductivity type having a resistivity of at least 0.05Ω-cm, in direct contact with said fourth single-crystal layer;
a second polycrystalline layer of the opposite conductivity type, superposed on and in direct contact with said first polycrystalline layer, said second polycrystalline layer having a resistivity lower than that of said first polycrystalline layer;
a first main electrode in low resistance contact with said second polycrystalline layer;
a second main electrode in low resistance contact with said first single-crystal layer; and
a control electrode in low resistance contact with one of said second and third single-crystal layers;
said fourth single-crystal layer being formed by diffusing from said first polycrystalline layer an impurity determining the opposite conductivity during the formation of said first and second polycrystalline layers, and having a total impurity quantity of $1 \times 10^{10}$ to $2 \times 10^{15}$ atoms/cm$^2$ and a thickness smaller than that of said third single-crystal layer.

9. The semiconductor device according to claim 8, wherein said polycrystalline layer is constructed of
a first polycrystalline layer part adjacent to said fourth single-crystal layer and
a second polycrystalline layer part adjacent to said first polycrystalline layer part,
said first polycrystalline layer part having a thickness of 0.1 to 30 μm and a resistivity of 0.1 to 250Ω-cm,
said second polycrystalline layer part having a resistivity of at most 0.1Ω-cm, and wherein
the sum of the thicknesses of said first and second polycrystalline layer parts is at least 2 μm.

10. The semiconductor device according to claim 8, wherein the total thickness of said second and third single-crystal layers is, at most, 400 μm, and the total impurity quantity per unit area of said fourth single-crystal layer is less than $3 \times 10^{14}$ atoms/cm$^2$.

11. The semiconductor device according to claim 10, wherein said first polycrystalline layer has a thickness of 0.1 to 30 μm and a resistivity of 0.1 to 250Ω-cm, and the resistivity of said second polycrystalline layer is, at most, 0.1Ω-cm, and the total thickness of said first and second polycrystalline layers is at least 2 μm.

12. A semiconductor device according to claim 8 wherein said second single-crystal layer has a thickness of at most 30 μm.

13. A semiconductor device according to claim 8 wherein said first polycrystalline layer has a thickness of 0.1 to 30 μm and a resistivity of 0.05 to 250Ω-cm, and said second polycrystalline layer has a resistivity of at most 0.05Ω-cm.

14. A semiconductor device according to claim 8 wherein the sum of the thicknesses of said first and second polycrystalline is at least 2 μm.

15. A semiconductor device according to claim 8 wherein the sum of the thicknesses of said second and third single cyrstal layers are at most 400 μm.

16. A semiconductor device having a low forward voltage comprising:
a semiconductor substrate including a first single-crystal layer of one conductivity type, a second single-crystal layer of the one conductivity type, adjoining said first single-crystal layer and having a higher resistivity than said first single-crystal layer, and a third single-crystal layer of the opposite conductivity type, adjoining said second single-crystal layer to form a P-N junction with said single-crystal layer;
a polycrystalline layer of the opposite conductivity type in direct contact with said third single-crystal layer, said polycrystalline layer having a resistivity of at least 0.05Ω-cm on the side which contacts the third single-crystal layer and a decrease in resistivity across the thickness of the polycrystalline layer;
a first main electrode in low resistance contact with said first single-crystal layer; and
a second main electrode in low resistance contact with said polycrystalline layer;
said third single-crystal layer being formed by diffusing from said first polycrystalline layer an impurity determining the opposite conductivity type during the formation of said first and second polycrystalline layers, and having a total impurity quantity of $1 \times 10^{10}$ to $2 \times 10^{15}$ atoms/cm$^2$ and a thickness smaller than that of said second single-crystal layer.

17. The semiconductor device according to claim 16, wherein the resistivity of said polycrystalline layer decreases in a linear manner through the layer.

18. The semiconductor device according to claim 16, wherein said polycrystalline layer is made up of a plurality of stacked polycrystalline layer portions each having a respectively different resistivity so as to form a polycrystalline layer having a stepwise decreasing resistivity from said single-crystal layer.

19. A semiconductor device having a low forward voltage comprising:
a semiconductor substrate including a first single-crystal layer of one conductivity type, a second single-crystal layer of the opposite conductivity type adjoining said first single-crystal layer to form a first P-N junction therebetween, said second single-crystal layer having a resistivity higher than that of said first single-crystal layer, a third single-crystal layer of the one conductivity type, adjoining said second single-crystal layer to form a second P-N junction therebetween, and a fourth single-crystal layer of the opposite conductivity type, adjoining said third single-crystal layer to form a third P-N junction therebetween, said fourth single-crystal layer having a resistivity lower than that of said third single-crystal layer;

a polycrystalline layer of the opposite conductivity type, in direct contact with said fourth single-crystal layer, said polycrystalline layer having a resistivity of at least 0.05Ω-cm on the side which controls the third single-crystal layer and a decrease in resistivity across the thickness of the polycrystalline layer;

a first main electrode in low resistance contact with said polycrystalline layer;

a second main electrode in low resistance contact with said first single-crystal layer; and a control electrode in low resistance contact with one of said second and third single-crystal layers;

said fourth single-crystal layer being formed by diffusing from said first polycrystalline layer an impurity determining the opposite conductivity during the formation of said first and second polycrystalline layers, and having a total impurity quantity of $1 \times 10^{10}$ to $2 \times 10^{15}$ atoms/cm$^2$ and a thickness smaller than that of said third single-crystal layer.

20. A semiconductor device according to claim 19, wherein the resistivity of said polycrystalline layer decreases in a linear manner through the layer.

21. A semiconductor device according to claim 19, wherein said polycrystalline layer is made up of a plurality of stacked polycrystalline layer portions each having a respectively different resistivity so as to form a polycrystalline layer having a stepwise decreasing resistivity from said single-crystal layer.

* * * * *